United States Patent [19]

Takano et al.

[11] Patent Number: 5,360,471
[45] Date of Patent: Nov. 1, 1994

[54] ELECTROLESS SOLDER PLATING BATH

[75] Inventors: Yoshihiko Takano; Atsuo Senda, both of Kyoto, Japan

[73] Assignee: Murata Manufacturing Co., Ltd., Japan

[21] Appl. No.: 101,387

[22] Filed: Aug. 2, 1993

[30] Foreign Application Priority Data

Aug. 5, 1992 [JP] Japan .................. 4-208750

[51] Int. Cl.$^5$ .................. C23C 18/48; C23C 18/52
[52] U.S. Cl. .................. 106/1.22; 106/1.25; 427/443.1
[58] Field of Search ............... 106/1.22, 1.25; 427/443.1

[56] References Cited

U.S. PATENT DOCUMENTS

| | | | |
|---|---|---|---|
| 4,194,913 | 3/1980 | Davis | 106/1.22 |
| 5,143,544 | 9/1992 | Iantosca | 106/1.22 |
| 5,160,373 | 11/1992 | Senda et al. | 106/1.27 |
| 5,169,692 | 12/1992 | Couble et al. | 106/1.25 |
| 5,173,109 | 12/1992 | Iantosca | 106/1.23 |

FOREIGN PATENT DOCUMENTS 460397 11/1991 European Pat. Off. .
4119807 12/1992 Germany .

OTHER PUBLICATIONS

"Electroless Tin Plating Bath", C-836, May 29, 1991, vol. 15, No. 211, Yutaka Kawabe.
"Electroless Plating Bath", C-885, Nov. 15, 1991, vol. 15, No. 450, Tetsuo Senda.

*Primary Examiner*—Helene Klemanski
*Attorney, Agent, or Firm*—Ostrolenk, Faber, Gerb & Soffen

[57] ABSTRACT

Disclosed herein is an electroless solder plating bath capable of autocatalytically depositing solder on a metal such as copper or nickel or an activated non-conductor base material in an arbitrary film thickness and an arbitrary film composition. This plating bath contains bivalent ions of tin and bivalent ions of lead as metal ions, a complexing agent, and a reductant, while the reductant contains trivalent titanium ions. The plating bath can be used at a temperature of 40° to 80° C., with a pH value of 5.0 to 11.0.

14 Claims, No Drawings

ELECTROLESS SOLDER PLATING BATH

BACKGROUND OF THE INVENTION

1. Field of the Invention

The present invention relates to an electroless solder plating bath, and more particularly, it relates to an improvement in a reductant which is contained in such a plating bath.

2. Description of the Background Art

In general, solder plating is industrially carried out by electroplating at present. In such electroplating, however, the as-obtained plating film may be irregular in thickness as a result of current distribution or the like. While various methods to take the place of electroless plating have been studied as hereafter described, these methods still have problems to be solved.

In order to deposit any one of tin, lead and solder by electroless plating, for example, a reductant may be prepared from sodium hypophosphite, formaldehyde or borohydride, which reductant is that employed in ordinary electroless nickel plating or electroless copper plating. However, tin and lead are known as elements which exhibit catalytic toxicity, suppressing or stopping the plating reaction when the same are added into an electroless nickel plating bath or an electroless copper plating bath. Therefore, it is impossible to deposit solder in an electroless manner by using the aforementioned reductant in an electroless solder plating operation. Even if solder can be slightly deposited, it is absolutely impossible to form a thick plating film since tin and lead have no autocatalytic properties.

There has also been reported a plating method of employing thiourea for attaining electrolytical replacement on copper and a deposition method utilizing disproportionation of tin. In the former method, however, the base material to be plated must be acid-resistant since the plating bath is prepared from a strongly acidic solution, while the electrolytical replacement reaction takes place only on copper. In the latter method, on the other hand, no disproportionation takes place unless the plating bath is strongly alkaline, while only a simple substance of tin causes reaction.

SUMMARY OF THE INVENTION

Accordingly, an object of the present invention is to provide an electroless solder plating bath which can autocatalytically deposit solder on both a metal and an activated non-conductor base material with an arbitrary film thickness and an arbitrary film composition.

In order to solve the aforementioned technical problem, the inventive electroless solder plating bath contains bivalent ions of tin and those of lead as metal ions, a complexing agent, and a reductant, while the reductant contains trivalent titanium ions.

According to the present invention, the reductant is prepared from trivalent titanium ions so that it is possible to autocatalytically deposit a solder plating film on a metal such as copper or nickel, or a non-conductor base material which is activated by an $SnCl_2$ solution and a $PdCl_2$ solution, for example.

In the electroless plating reaction through the inventive electroless solder plating bath, electrons resulting from oxidative reaction of the trivalent titanium ions forming the reductant conceivably reduce tin ions and lead ions contained in the plating bath to change the tin and lead ions into metallic states. Such changes are briefly expressed as follows:

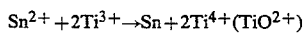

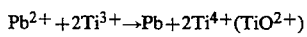

This plating reaction is attended with no evolution of hydrogen, and results in small abnormal deposition, which is pointed out as a problem in electroless copper plating or the like. As to the solder plating film which is deposited on a target of plating, it is possible to attain an arbitrary thickness by autocatalytically continuing the reaction. Due to the reductant prepared from trivalent titanium ions, tin and lead exhibit no catalytic toxicity.

According to the present invention, therefore, it is possible to obtain a solder plating film of an arbitrary thickness by controlling the bath temperature, the plating time and the like. Further, it is possible to obtain an arbitrary film composition by changing concentration values of the bivalent ions of tin and those of lead which are contained in the plating bath, the pH value of the bath and the like.

In addition, it is possible to set the pH value of the plating bath within a weak-acidic to alkaline range of 5.0 to 11.0, whereby the base material is hardly eroded and danger is reduced in operation.

The foregoing and other objects, features, aspects and advantages of the present invention will become more apparent from the following detailed description of the present invention.

DESCRIPTION OF THE PREFERRED EMBODIMENTS

In the electroless solder plating bath according to the present invention, bivalent ions of tin are prepared from $SnCl_2$, $SnSO_4$ or $Sn(CH_3COO)_2$, for example. On the other hand, bivalent ions of lead are prepared from $PbCl_2$ or $PbSO_4$, for example.

The complexing agent for the bivalent tin ions and the bivalent lead ions can be prepared from aminopolycarboxylic acid such as ethylenediamine-tetraacetic acid disodium. A complexing agent for the trivalent titanium ions forming the reductant can be prepared from nitrilotriacetic acid. In addition, an oxycarboxylic acid such as citric acid may be employed, although the same is unspecifiable as a complexing agent for specific ions. The aforementioned complexing agents are mere examples and the present invention is not restricted to these, as a matter of course.

Trivalent titanium ions are prepared from $TiCl_3$, $Ti(S_2O_4)_3$, $TiI_3$ or $Ti(C_5H_5)_3$, for example.

In consideration of the aforementioned composition, an electroless solder plating bath according to an embodiment of the present invention is selected to have the following composition, for example:

trisodium citrate 0.05 to 0.50 mol/lit.
ethylenediamine-tetraacetic acid disodium 0.02 to 0.16 mol/lit.
nitrilotriacetic acid 0.05 to 0.40 mol/lit.
stannous chloride + lead chloride 0.02 to 0.16 mol/lit.
titanium trichloride 0.02 to 0.08 mol/lit.

While plating deposition is possible at room temperature, the temperature of the plating bath is preferably within a range of 40° to 80° C. in consideration of the deposition rate. The deposition rate is reduced if the bath temperature is less than 40° C., while the plating bath is so easily decomposed that abnormal deposition is caused on a substance other than the target or the deposit is precipitated if the temperature exceeds 80° C.

The pH value of the plating bath is preferably within a weak-acidic to alkaline region, i.e., 5.0 to 11.0. The deposition rate is reduced if the pH value is less than 5.0, while the plating bath is so easily decomposed that abnormal deposition is caused on a substance other than the target or the deposit is precipitated if the pH value exceeds 11.0. A pH regulator may be prepared from aqueous ammonia or sodium carbonate, which can inhibit the metal ions from forming hydroxide in the plating bath.

The target of electroless solder plating is prepared from a metal such as nickel or copper, or a non-conductive material such as a plastic or ceramic material. When a metal is to be plated, its surface is preferably cleaned by acid cleaning or polishing. When a non-conductive material is to be plated, on the other hand, a catalyst is preferably previously applied to its surface with a tin solution and a palladium solution.

Experimental Examples which were made according to the present invention are now described.

Experimental Example 1

An electroless solder plating bath having the following composition was prepared:

| | |
|---|---|
| trisodium citrate salt | 0.34 mol/lit. |
| EDTA-disodium salt | 0.08 mol/lit |
| nitrilotriacetic acid (NTA) | 0.20 mol/lit. |
| $SnCl_2 \cdot 2H_2O$ | 0.08 mol/lit. |
| $PbCl_2$ | 0.0016 mol/lit. |
| $TiCl_{23}$ | 0.04 mol/lit. |
| (pH regulator: 28% aqueous ammonia) | |

An electroless Ni—P plating film which was activated with an $SnCl_2$ solution and a $PdCl_2$ solution was plated for 60 minutes under conditions of pH 9.0 and 70° C., to obtain a solder plating film of 2 μm in thickness. The film composition was Sn:Pb=60:40.

Experimental Example 2

An electroless solder plating bath having the following composition was prepared:

| | |
|---|---|
| trisodium citrate salt | 0.34 mol/lit. |
| EDTA-disodium salt | 0.08 mol/lit. |
| nitrilotriacetic acid (NTA) | 0.20 mol/lit. |
| $SnCl_2 \cdot 2H_2O$ | 0.08 mol/lit. |
| $PbCl_2$ | 0.0016 mol/lit. |
| thiourea | 0.08 mol/lit. |
| $TiCl_3$ | 0.04 mol/lit. |
| (pH regulator: 28% aqueous ammonia) | |

An acid-dipped copper plate was plated for 45 hours under conditions of pH 9.0 and 70° C., to obtain a solder plating film of 1 μm in thickness. The film composition was Sn:Pb=70:30.

Although the present invention has been described in detail, it is clearly understood that the same is by way of illustration and example only and is not to be taken by way of limitation, the scope of the present invention being limited only by the terms of the appended claims.

What is claimed is:

1. An electroless solder plating bath containing bivalent ions of tin and of lead, a complexing agent, and a reductant, said reductant containing trivalent titanium ions in an amount sufficient to convert tin and lead ions to the metallic state.

2. An electroless solder plating bath in accordance with claim 1, wherein the pH value is 5.0 to 11.0.

3. An electroless solder plating bath in accordance with claim 1, having the following composition:
  trisodium citrate 0.05 to 0.50 mol/lit. ethylenediamine-tetraacetic acid disodium 0.02 to 0.16 mol/lit.
  nitrilotriacetic acid 0.05 to 0.40 mol/lit.
  stannous chloride+lead chloride 0.02 to 0.16 mol/lit.
  titanium trichloride 0.02 to 0.08 mol/lit.

4. An electroless solder plating bath in accordance with claim 3, wherein the pH value is 5.0 to 11.0.

5. An electroless solder plating bath in accordance with claim 1 containing a pH regulating agent.

6. An electroless solder plating bath in accordance with claim 2 containing a pH regulating agent.

7. An electroless solder plating bath in accordance with claim 3 containing a pH regulating agent.

8. An electroless solder plating bath in accordance with claim 4 containing a pH regulating agent.

9. In a method of solder plating by contacting a substrate with an electroless solder plating bath, the improvement which comprises utilizing the electroless solder plating bath of claim 1.

10. A method of claim 9 in which the electroless plating is effected at a temperature of 40°–80° C.

11. In a method of solder plating by contacting a substrate with an electroless solder plating bath, the improvement which comprises utilizing the electroless solder plating bath of claim 2.

12. In a method of solder plating by contacting a substrate with an electroless solder plating bath, the improvement which comprises utilizing the electroless solder plating bath of claim 3.

13. In a method of solder plating by contacting a substrate with an electroless solder plating bath, the improvement which comprises utilizing the electroless solder plating bath of claim 4.

14. An electroless solder plating bath in accordance with claim 1, wherein the amount of trivalent titanium ions is 0.02 to 0.08 mol/lit.

* * * * *